United States Patent
Saijo et al.

(10) Patent No.: US 6,503,089 B2
(45) Date of Patent: Jan. 7, 2003

(54) SOCKET FOR ELECTRICAL PARTS

(75) Inventors: Takashi Saijo, Kawaguchi (JP);
Takayuki Yamada, Kawaguchi (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 09/805,048

(22) Filed: Mar. 14, 2001

(65) Prior Publication Data

US 2001/0023140 A1 Sep. 20, 2001

(30) Foreign Application Priority Data

Mar. 15, 2000 (JP) ........................................ 2000-071514

(51) Int. Cl.7 .............................................. H01R 12/00
(52) U.S. Cl. ......................................... 439/70; 439/700
(58) Field of Search ............................... 439/66, 70, 71, 439/700, 824

(56) References Cited

U.S. PATENT DOCUMENTS 5,727,954 A * 3/1998 Kato et al. .................... 439/66

* cited by examiner

Primary Examiner—Khiem Nguyen
(74) Attorney, Agent, or Firm—Staas & Halsey LLP

(57) ABSTRACT

In an IC socket for an electrical part, a contact pin electrically connecting a terminal of an electrical part and a printed circuit board is provided for a socket body of an IC socket. The contact pin comprises a sleeve having a space with one end opening, a plunger inserted into the sleeve through the end opening thereof to be vertically movable and an elastic member for urging downward the plunger. The sleeve is arranged to be vertically movable with respect to the socket body and is provided with a contact portion formed to an upper end thereof contacts a terminal of the electrical part to be electrically connected thereto and the plunger has a lower end contacting the printed circuit board to establish an electrical connection therebetween.

13 Claims, 7 Drawing Sheets

PRIOR ART

PRIOR ART

SOCKET FOR ELECTRICAL PARTS

BACKGROUND OF THE INVENTION

The present invention relates to a socket for an electrical part for detachably accommodating an electrical part such as semiconductor device (called hereunder "IC package"), and more particularly, a socket for an electrical part having improved contact pins contacting terminals of the electrical part.

An IC socket as a socket for an electrical part having a conventional structure is shown, for example, in FIGS. 7 and 8, which corresponds to a structure disclosed in the Japanese Utility Model Laid-open Publication No. SHO 63-61788.

In the structure of the IC socket shown in these figures, a float plate 3 is disposed on a base 5 of a socket body 2 to be vertically movable under a state being upward urged, as viewed, and an IC package 6 is mounted on this float plate 3.

The IC package 6 includes a package body 6a having a lower surface to which a number of terminals 6b are arranged with narrow pitch between adjacent ones.

A number of contact pins 7 are electrically connected to the terminals 6b, respectively. Each of these contact pins 7 comprises a cylindrical (tubular) piece 7a, upper and lower contact pieces 7b and 7c disposed inside the tubular piece 7a and a coil spring 7d also disposed inside the tubular piece 7a so as to be interposed between the upper and lower contact pieces 7b and 7c. These contact pieces 7b and 7c and coil springs 7d are formed of conductive materials. In such structure, the upper contact piece 7b is urged upward, and the tubular piece 7a is inserted under pressure into the socket body 2, or the tubular piece 7a is idly fitted to the float plate 3 and the lower contact piece 7c is inserted into an insertion hole 9a formed to a printed circuit board 9 to thereby establish an electrical connection. The socket body 2 is fastened to the printed circuit board by means of bolts 10 or like.

Furthermore, a radiation (radiator) plate 11 is disposed above the IC package 6 so as to press the IC package 6 from the upper side thereof, and both end portions of this radiation plate 11 is depressed by a rotatable (pivotal) pressing members 12.

By depressing downward the radiation plate 11 by the pressing members 12, the IC package 6 is also depressed downward and the terminal 6b is pressed by the upper contact piece 7b of the contact pin 7. Accordingly, the IC package 6 is electrically connected to the printed circuit board 9 through the upper contact piece 7b, the coil spring 7d and the lower contact piece 7c. At this time, the upper contact piece 7b is vertically displaced and contacted under pressure to the terminal 6b of the IC package 6 by the urging force of the coil spring 7a, thus being electrically contacted thereto.

However, in the conventional example of the structure mentioned above, the contact pin 7 is composed of the tubular piece 7a, the upper contact piece 7b, the lower contact piece 7c and the coil spring 7d. Thus, the contact piece 7 has many constructional elements and assembling steps are complicated and increased.

Moreover, for the IC package 6, it is required to make small (fine) a pitch of the terminals 6a arranged to the lower surface of the package body 6a, and accordingly, it is also required to make small a pitch of the contact pins 7. Furthermore, it is required to widen or make wide an allowance (allowable range) to positional shifting of the terminal 6b, and for this reason, it is required to widen an area of a contact portion of the contact pin 7 contacting the terminal 6b of the IC package 6.

In a Ball Grid Array (BGA) type package, particularly, in order to avoid a damage to a portion near the center of the lower portion of a solder ball as terminal, it is necessary to sufficiently ensure an area of a recessed portion formed to the central portion of a contact portion of the contact pin contacting the solder ball. If be not ensured, the lower central portion of the solder ball abuts against a portion, not recessed portion, of the contact portion, and thus, this portion may be damaged.

However, in the contact pin 7 of the conventional structure, the diameter of the tubular piece 7a is larger than the upper contact piece 7b having a contact portion. Therefore, it is difficult to sufficiently secure the contact portion contacting the terminal, and hence, also difficult to make fine the pitch of the contact pin 7.

SUMMARY OF THE INVENTION

An object of the present invention is to substantially eliminate defects or drawbacks encountered in the prior art mentioned above and to provide a socket for an electrical part having a structure capable of reducing the number of constructional parts or elements and assembling steps thereof.

Another object of the present invention is to provide a socket for an electrical part capable of ensuring a sufficient area of a contact portion of the contact pin contacting a terminal of the electrical part with fine pitch.

These and other objects can be achieved according to the present invention by providing, in one aspect, an IC socket for an electrical part in which a contact pin electrically connecting a terminal of an electrical part and a printed circuit board is provided for a socket body of an IC socket, wherein the contact pin comprises a sleeve having a space having one end opening, a plunger inserted into the sleeve through the end opening thereof to be vertically movable and an elastic member for urging downward the plunger in an vertical attitude of the contact pin, and the sleeve is arranged to be vertically movable with respect to the socket body and is provided with a contact portion formed to an upper end thereof contacts a terminal of the electrical part to be electrically connected thereto and the plunger has a lower end contacting the printed circuit board to establish an electrical connection therebetween.

In preferred embodiments of this aspect, the plunger is arranged to be vertically movable with respect to the socket body. The sleeve and the plunger are disposed to be relatively slidable to thereby establish an electrical connection therebetween. The contact portion of the sleeve is formed with a central recessed portion and/or the contact portion of the sleeve is formed with a plurality of sharp protruded portions.

In a more detailed aspect, there is provided an IC socket for an electrical part for establishing an electrical connection between a printed circuit board and a terminal of an IC package, comprising:

a socket body to which the IC package is mounted;

a plurality of contact pins provided for the socket body through which a plurality of terminals of the electrical part are electrically connected to the printed circuit board; and means mounted to the socket body to press the electrical part against the socket body, each of the contact pins comprising, in a vertical attitude thereof:

a sleeve having an inner space having one end opening;

a plunger inserted into the sleeve through the end opening thereof to be vertically movable; and an elastic member for urging downward the plunger, the sleeve being arranged to be vertically movable with respect to the socket body and being provided with a contact portion at an upper end thereof contacting to the terminal of the electrical part to be electrically connected.

In preferred embodiments of this aspect, the means to press the electrical part is a cover member pivotally mounted to the socket body.

The sleeve is composed of a tubular member into which the plunger is fitted and the elastic member is disposed, the elastic member is a coil spring which urges the plunger downward so as to abut against the printed circuit board to establish an electrical connection therebetween.

The socket body has a base on which a plate member is rested, the plate member being formed with a through hole through which the tubular member of the sleeve is inserted.

The tubular portion is formed with an annular protruded portion to an outer periphery thereof and the plate member is formed with a stepped portion to which the annular protruded portion abuts when the tubular member is inserted into the through hole formed to the plate member to thereby restrict an upward movement of the sleeve.

The contact portion of the sleeve is formed with a central recessed portion.

According to the preferred aspects of the present invention mentioned above, since the contact pin is composed of three parts of the sleeve, the plunger and the elastic member such as coil spring, the number of constitutional elements can be reduced and, hence, assembling steps can be made simple and reduced.

Furthermore, since the contact portion is formed to the sleeve having the inner space into which the elastic member is fitted, the diameter of the contact portion can be made larger than a diameter of a contact portion formed to a plunger which is inserted into the space. As a result, an occurrence of a damage to a portion near the central portion of the terminal of the electrical part can be avoided and the allowance to the positional shifting of the terminal can be made large, thus realizing a compact structure of the terminal of the electrical part.

Furthermore, according to the preferred embodiments, the plunger of the contact pin can be pressed under pressure against the printed circuit board by the urging force of the elastic member, so that the contacting stability of the contact pin can be ensured and an invasion of a foreign material into a space between the plunger and the printed circuit board can be prevented.

Since the plunger is urged upward and the sleeve is urged downward in a state of the electrical part being accommodated in the socket body, the elastic member is compressed from its both longitudinal directions. Thus, the repulsive force is increased and, hence, the contacting stability of the contact pin can be ensured.

Still furthermore, through the relative sliding movement between the sleeve and the plunger, both the elements are rubbed to each other, realizing an electrical conductive state therebetween. This conductive path may be added to the conductive path of the sleeve, the plunger and the elastic member, whereby high frequency performance may be improved.

Still furthermore, the formation of the sharp protruded portions to the top end portion of the contact portion of the contact pin makes it possible to bite the terminal such as solder ball and, hence, effectively support the conductive state.

The nature and further characteristic features of the present invention will be made more clear from the following descriptions made with reference to the accompanying drawings.

DESCRIPTION OF THE PREFERRED EMBODIMENTS

Figure 1:
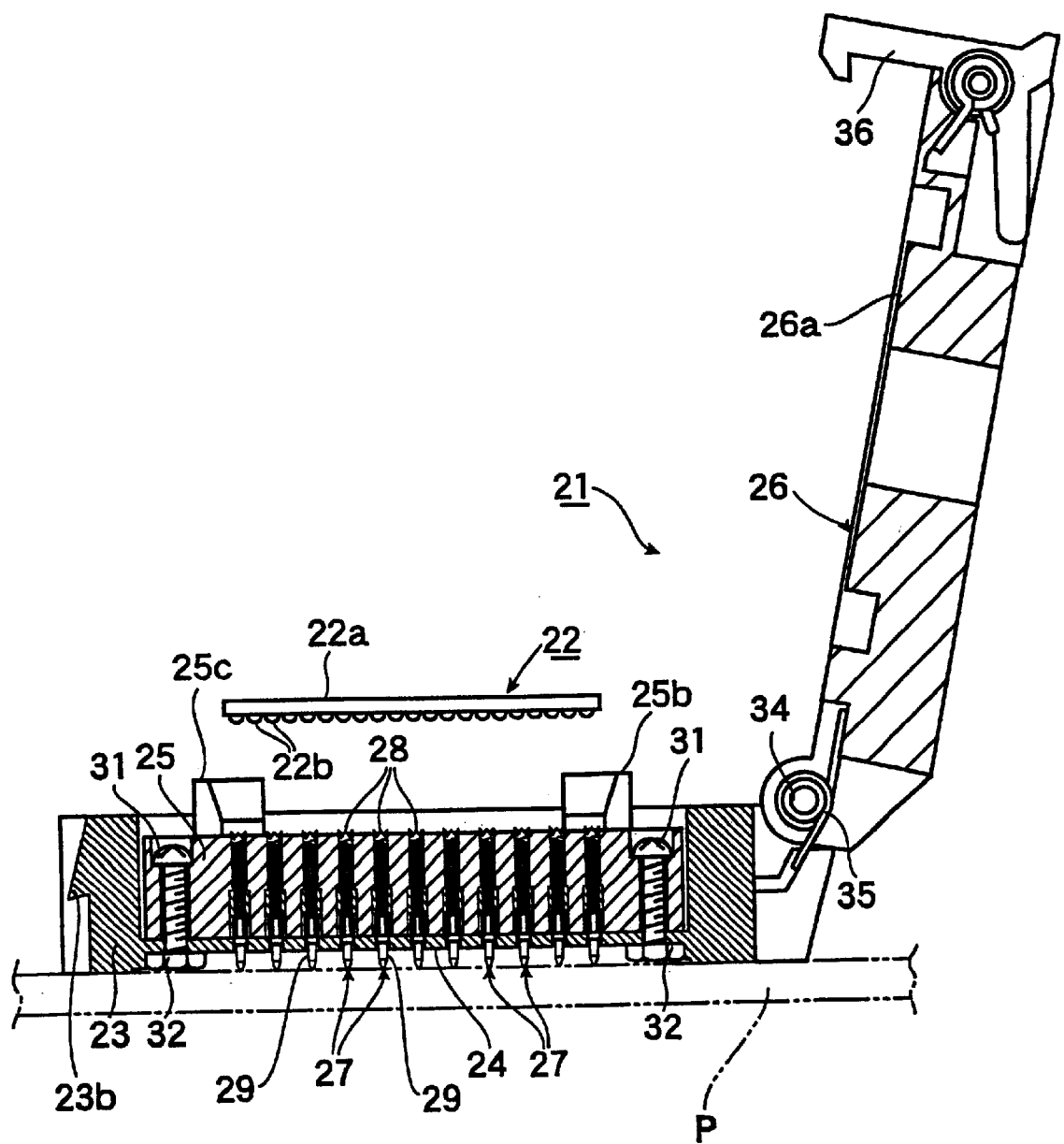
FIG. 1 is a sectional view of an IC socket according to a first embodiment of the present invention with a cover being opened.

Preferred embodiments of the present invention and modifications thereof will be described hereunder with reference to the accompanying drawings.

[First Embodiment]

FIGS. 1 to 4 represent a first embodiment of the present invention.

With reference to FIGS. 1 to 4, a reference numeral 21 denotes an IC socket of surface package or mount type as "socket for an electrical part", and the IC socket 21 is a socket for achieving an electrical contact between a solder ball 22b as "terminal" of an IC package 22 as "electrical part" and a printed circuit board P of an IC test device for the purpose of carrying out of a performance test of the IC package 22.

Referring to FIG. 1, the illustrated IC package 22 is a package of so-called a BGA type, in which the IC package 22 has a package body 22a having a rectangular plate structure and a number of solder balls 22b are arranged to the lower surface portion of the package body 22a so as to project downward in a matrix arrangement with predetermined pitch.

On the other hand, the IC socket 21 comprises a socket body 23 having a base or base member 24 on which an upper side plate 25 is disposed as viewed in FIG. 1, so that the IC package 22 is rested on this upper side plate 25. A cover member 26 is pivotally mounted to the socket body 23 so as to press downward the IC package 22 from the upper side thereof. The IC socket 21 is further provided with a number of contact pins 27 in the matrix arrangement in conformity with the arrangement of the solder balls 22b mentioned hereinbefore for the purpose of realizing an electrical connection between the IC package 22 depressed by the cover member 26 and the printed circuit board P disposed to the lower side of the socket body 23 through the engagement between the contact pins 27 and the solder balls 22b as terminals.

Figure 3:
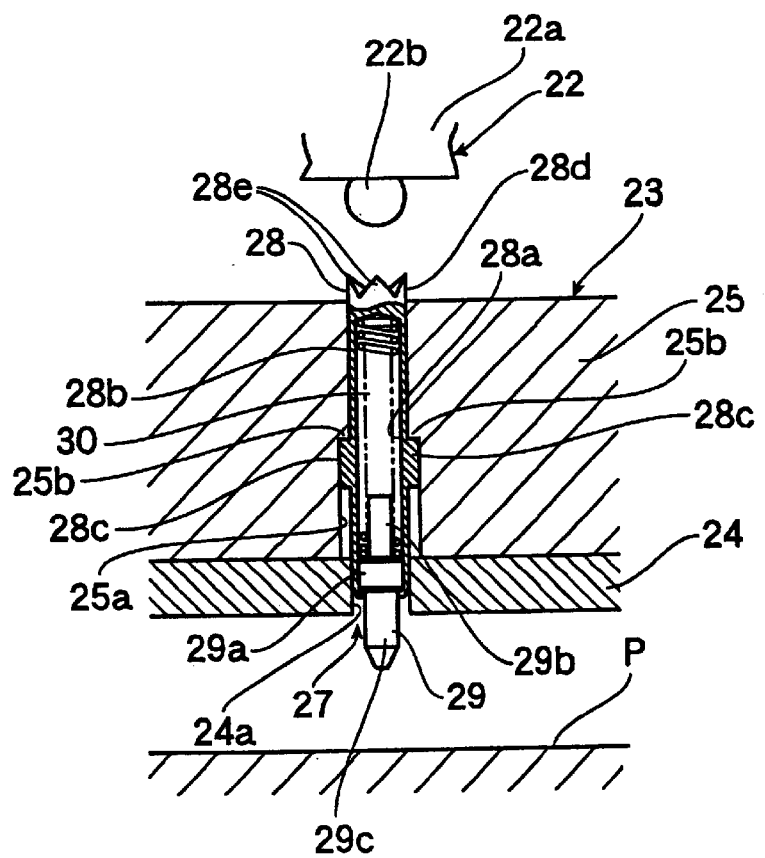
FIG. 3 is an enlarged sectional view showing a location condition of a contact pin of the IC socket of of the first embodiment of FIG. 1.

Each of the contact pins 27 is composed of a sleeve 28, a plunger 29 and a coil spring as an elastic member or piece 30, which are all formed of a conductive material, as shown in FIG. 3, for example.

With reference to FIG. 3, the sleeve 28 of the contact pin 27 has a tubular (cylindrical) portion 28b having a space 28a having a lower opening and inserted into a through hole 25a formed to the upper side plate 25 to be vertically movable. The tubular portion 28b is formed, at its outer peripheral portion, with an annular projection 28c, and under this projection 28c abutting against a stopper stepped portion 25b as shown in FIG. 3, the rising movement of the sleeve 28 is restricted.

Figure 4:
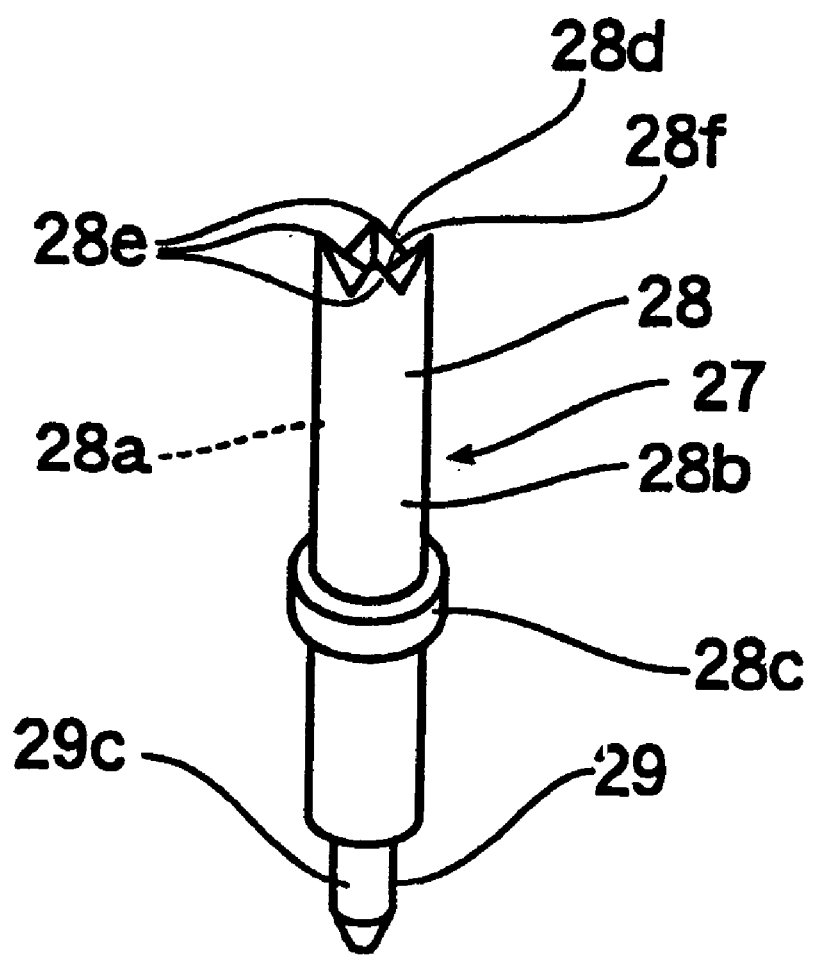
FIG. 4 is a perspective view of a contact pin of the IC socket of FIG. 1 or 3.

The sleeve 28 is also formed, at its upper end portion, with a contact portion 28d contacting the solder ball 22b of the IC package 22. The contact portion 28d is formed with a plurality of protruded portions in shape of mount and with a central recessed portion 28f as shown in FIG. 4.

The plunger 29 of the contact pin 27 has a central portion 29a having a diameter larger than that of an upper side portion 29b and that of a lower side portion 29c. When this plunger 29 is fitted into the sleeve 28, the central portion 29a having a large diameter portion is slid vertically along the inner peripheral surface of the tubular portion 28b of the sleeve 28. According to such sliding motion, the lower side portion 29c contacts the printed circuit board P to thereby establish an electrical conductive state therebetween. These sleeve 28 and the plunger 29 may be formed by using an automatic lathe, for example.

Further, the coil spring 30 is disposed inside the space 28a of the sleeve 28 so as to urge the sleeve 28 in the downward direction and the plunger in the upward direction.

Furthermore, as shown in FIG. 1, the base 24 and the upper side plate 25 are fastened together by means of bolt and nut assembly 31, 32, and four guide sections 25c for positioning the transverse direction of the IC package 22 are formed to the upper side plate 25 at its four portions corresponding to four corner portions of the rectangular package body 22a.

Figure 2:
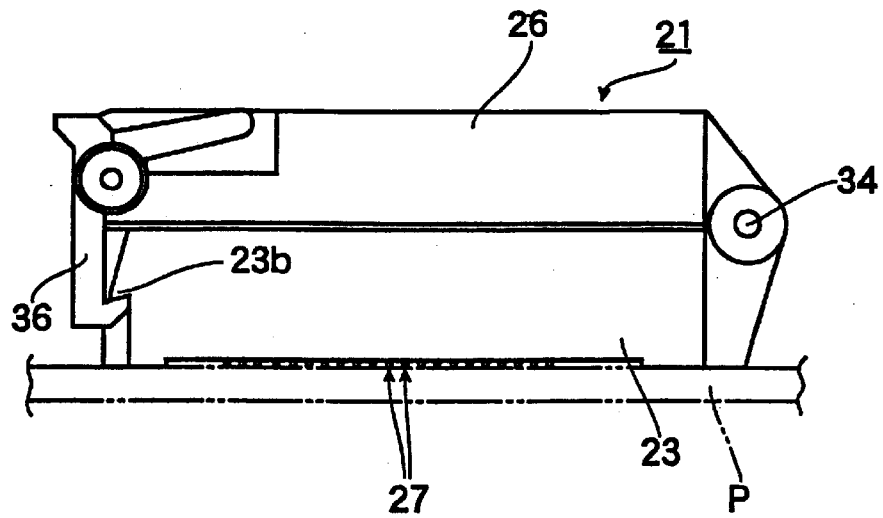
FIG. 2 is an illustration of a side view of the IC socket of FIG. 1 with the cover being closed.

The cover member 26 is pivotally mounted, at its base end side, to the socket body 23 through a pivot (shaft) 34 and urged by a spring 35 in a direction to be opened, i.e. clockwise direction in FIG. 1. In the closed state of the cover member 26, a latch member 36 provided for the front (top) end portion of the cover member 26 is engaged with an engagement portion 23b of the socket body 23 to keep the cover closed state as shown in FIG. 2. Further, the cover member 26 is formed with a pressing portion 26a for pressing the package body 22a in the cover closed state.

The contact pins 27 are assembled (mounted) to the socket body 23 in the manner such that the contact pins 27 are inserted into the through holes 25a of the upper side plate 25 in the state before the assembling of the base 24 and the upper side plate 25.

Then, the upper side plate 25 having the inserted contact pins 27 is mounted to the base 24 and the plunger 29 of the contact pins 27 are inserted into the through holes 24a of the base 24. Thereafter, the base 24 and the upper side plate 25 are fastened by the bolt 31 and the nut 32 as mentioned above. According to the described manner, the contact pins 27 are mounted to the socket body 23.

The IC socket 21 of the structure mentioned above will be utilized in the following manner.

Preliminarily, the IC socket 21 is mounted to the printed circuit board P. In this state, the plunger 29 of the contact pin 27 abuts against the printed circuit board P and the printed circuit board P is raised upward from the position shown in FIG. 3 against the urging force of the spring 30. As a result, the plunger 29 is pressed against the printed circuit board P by the urging force of the spring 30, thus ensuring the contacting stability therebetween and preventing invasion of foreign material between the plunger 29 and the printed circuit board P.

From the state mentioned above, the IC package 22 is accommodated in each of the IC sockets 21 and the electrical connection between the IC package 22 and the printed circuit board P is attempted as follows.

Under the opened state of the cover member 26 shown in FIG. 1, the IC package 22 is conveyed by an automatic machine, for example, guided on the upper side plate 25 by the guide members 25c and then mounted on the predetermined position.

Thereafter, when the cover member 26 is closed, the IC package 22 is depressed by the pressing portion 26a, whereby the solder balls 22b abut against the contact portions 28d of the sleeves 28 of the contact pins 27, respectively, and the sleeves 28 are lowered against the elastic force of the spring coils 30 to thereby ensure an electrical connection between the solder balls 22b and the contact portions 28d of the sleeves 28, respectively. According to the lowering motion of the sleeve 28, the urging force of the coil spring 30 is increased and the contacting pressure of the plunger 29 against the printed circuit board P can be further improved.

During the operation mentioned above, the sleeve 28 and the plunger 29 are relatively moved and slid, and both the members are rubbed to each other and hence become electrically conductive. Accordingly, by adding this conductive path to a conductive path formed by the sleeve 28, the coil spring 30 and the plunger 29, high frequency characteristic can be enhanced and improved.

According to the manner that the IC package 22 is electrically connected to the printed circuit board P through the IC socket 21 as mentioned above, the performance test of the IC package 22 will be carried out.

According to the present invention of the structure mentioned above, since the contact pin 27 is composed of the sleeve 28, the plunger 29 and the coil spring 30, the number of parts therefor can be reduced, thus reducing the assembling steps.

Furthermore, since the contact portion 28d is formed to the sleeve 28 having the space 28a into which the coil spring 30 is inserted, the contact portion 28d can be formed with a large diameter in comparison with a conventional structure in which a contact portion 28d is formed to a plunger 29 to be inserted into such space 28a.

As a result, an occurrence of a damage to a portion near the central portion of a spherical lower end portion of the solder ball 22b of the IC package 22 will be avoided, and the allowance to the positional shifting of the solder ball 22b can be made large. It is therefore possible to make compact and small the solder ball 22b.

Furthermore, since the contact portion 28d of the sleeve 28 is formed with the central recessed portion 28f, the occurrence of the damage to the central portion of the spherical lower end of the solder ball 22b can be further prevented, and moreover, since a plurality of protruded portions 28e having sharp ends are formed to the sleeve 28, these sharp protruded portions bite portions of the solder ball 22b other than the lower central portion 28f, thus further improving the electrical conductive state therebetween.

Still furthermore, in the accommodation state of the IC package 22, the sleeve 28 is pushed downward and the plunger 29 is pushed upward, so that the coil spring 30 is pushed and then compressed in both the longitudinal directions thereof. Thus, the repulsive force of the coil spring 30 is thereby increased, and even if a coil spring having a short length is utilized, the contacting stability can be ensured.

[Second Embodiment]

Figure 5:
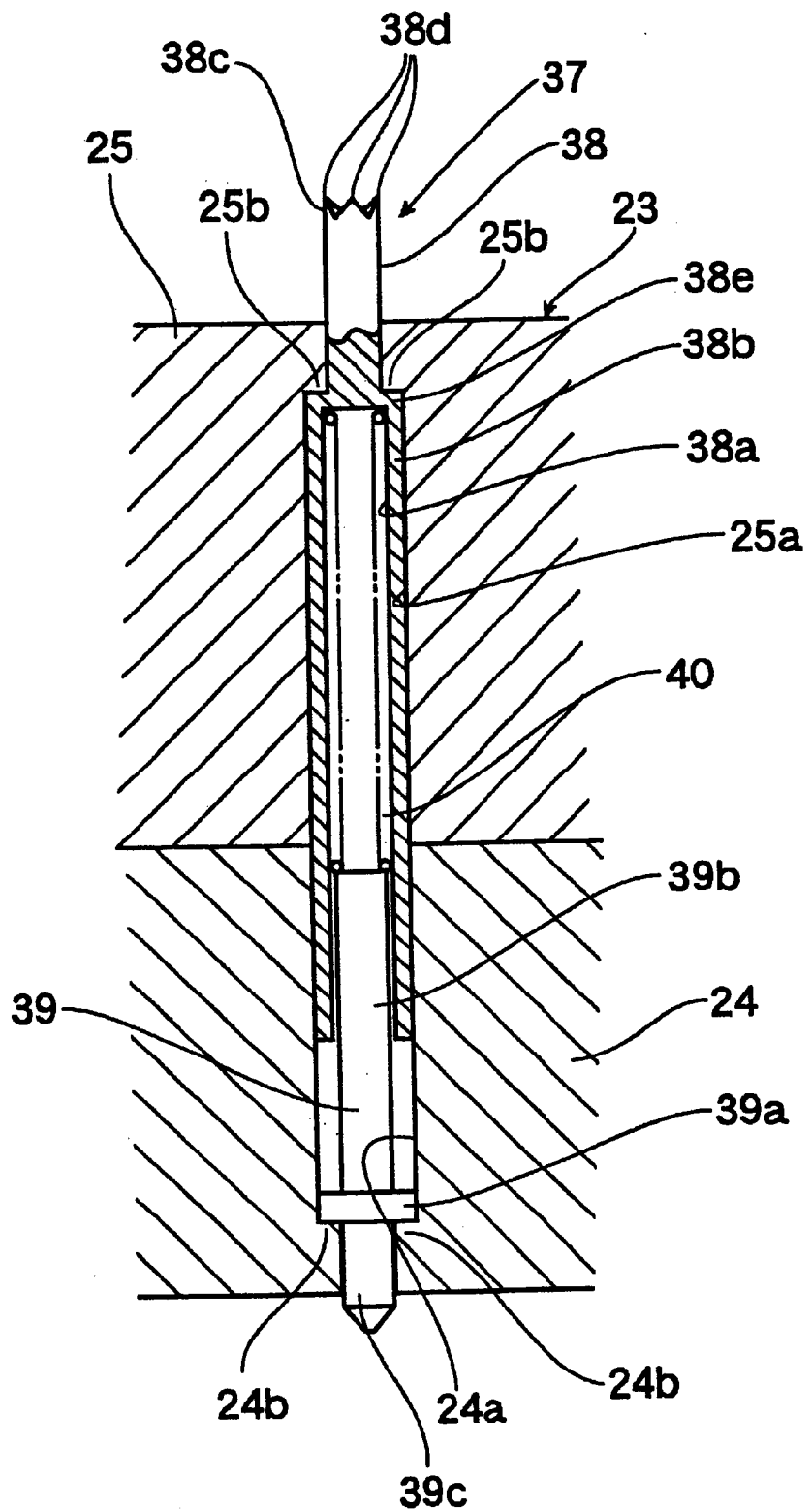
FIG. 5 is an enlarged sectional view showing a location condition of a contact pin of a second embodiment of the IC socket of the present invention.

FIG. 5 illustrates a second embodiment of the present invention.

In this second embodiment, a contact pin 37 is composed of a sleeve 38, a plunger 39 and a coil spring 40 as elastic member.

With reference to FIG. 5, the sleeve 38 of the contact pin 37 has a tubular (cylindrical) portion 38b having a space 38a. The sleeve 38 is also formed, at its upper end portion, with a contact portion 38d having a diameter smaller than that of the tubular portion 38b. The contact portion 38c is formed with a plurality of protruded portions 38d in shape of mount as in the former embodiment.

The sleeve 38 is inserted into the through hole 25a of the upper side plate 25 to be vertically movable, and as shown in FIG. 5, a stepped portion 38e is formed between the tubular portion 38b and the contact portion 38c. This stepped portion 38e abuts against the stopper stepped portion 25b formed to the through hole 25a to thereby restrict the upward movement of the sleeve 38.

The plunger 39 of the contact pin 37 has an intermediate flange portion 39a having a diameter larger than that of an upper side portion 39b and that of a lower side portion 39c, between which the intermediate flange portion 39a is formed. When the upper side portion 39b of the plunger 39 is fitted into the tubular portion 38b of the sleeve 38 from the lower side thereof as viewed, the flange portion 39a having a large diameter portion is slid vertically along the inner peripheral surface of the through hole 24a of the base 24 to be thereby vertically movable. Then, when the flange portion 39a abuts, as shown in FIG. 5, against the stopper stepped portion 24b of the base 24, the lowering motion of the plunger 39 is restricted. The lower side portion 39c of the plunger 39 is protruded downward from the base 24 and contacted to the printed circuit board to thereby establish an electrical connection therebetween.

Still furthermore, the coil spring 40 is disposed in the space 38a of the sleeve 38 to urge the sleeve 38 upward and urge the plunger downward.

It is to be noted that the present invention is not limited to the described embodiments and many other changes and modifications may be made without departing from the scopes of the appended claims.

Figure 6A:
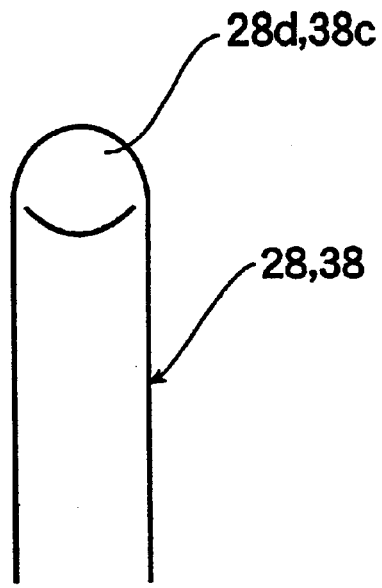
FIG. 6 includes FIGS. 6A, 6B, 6C and 6D showing illustrated perspective view of modified examples of the contact pins according to the first and second embodiments of the present invention.
Figure 6B:
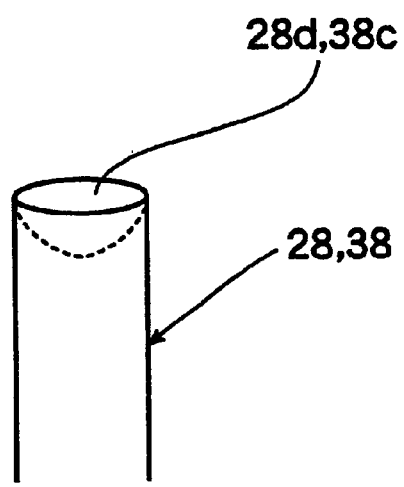
Figure 6C:
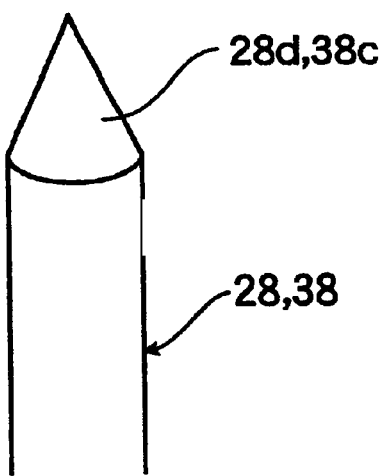
Figure 6D:
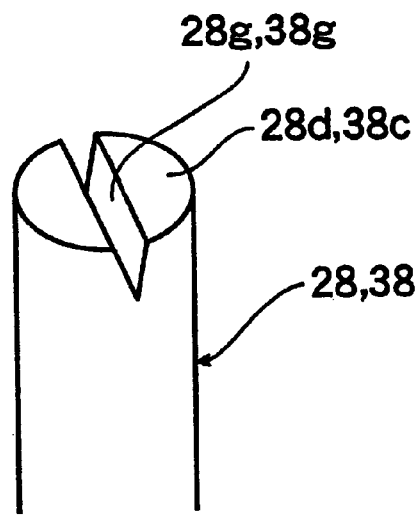
Figure 7:
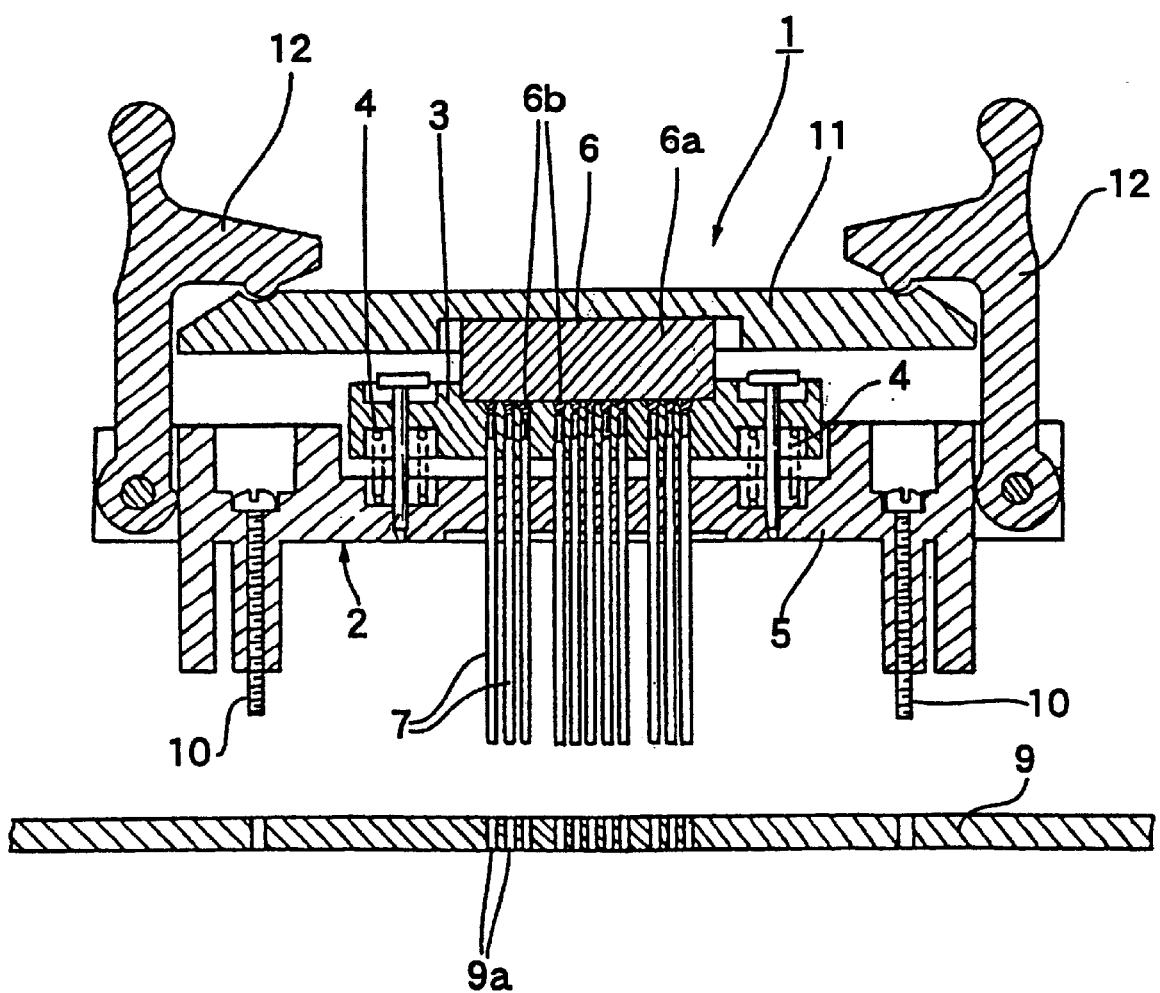
FIG. 7 is a sectional view of an IC socket of a conventional structure.
Figure 8:
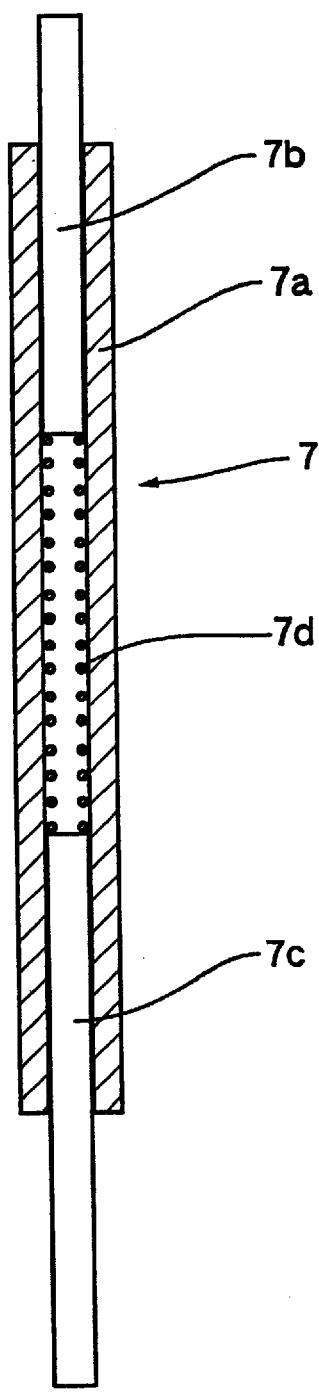
FIG. 8 is an enlarged sectional view of a contact pin of a conventional structure.

For example, although, in the first and second embodiments mentioned above, the contact portions 28d and 38d of the sleeves 28 and 38 are formed with a plurality of sharp protruded portions in shape of mounts, these contact portions 28d and 38d may be formed so as to provide an R (round)-shape (FIG. 6A), a conical shape (FIG. 6B), a recessed bawl shape (FIG. 6C) and a V-cut shape (FIG. 6D).

Moreover, although, in the described embodiments, the present invention is applied to the IC socket 21 for the IC package 22 of BGA type structure, the present invention is not limited to such BGA type and is applicable to an IC package such as LGA (Land Grid Array) type or PGA (Pin Grid Array) type in which terminals are provided to the lower surface of the IC package and also applicable to an IC package such as QFP (Quad Flat Package) type in which terminals are provided at the side surface of the IC package.

Still furthermore, although, in the described embodiments, the present invention is applied to a clamshell type IC socket 21 provided with the cover member 26, the present invention is not limited to such structure and is applicable to an open-top type IC socket or a structure in which a pusher for pushing an electrical part is provided on the automatic machine side.

What is claimed is:

1. An IC socket for an electrical part to electrically connect a terminal of the electrical part and a printed circuit board, the socket comprising:
  a socket body on which the electrical part is accommodated, the socket body having:
    an upper plate, and
    a base member on which the upper plate is mounted;
  a first through hole vertically provided in the upper plate, the first through hole having:
    a small diameter through hole positioned at an upper side of the first through hole,
    a large diameter through hole positioned at a lower side of the first through hole,
    the small and large diameter through holes being continuously formed to thereby produce a stepped portion around a connecting portion thereof;
  a second through hole vertically provided in the base member, the first and second through holes being connected to each other by mounting the upper plate on the base member; and
  a contact pin to electrically connect the terminal and the printed circuit board, said contact pin comprising:
    a tubular sleeve having a space with an opened lower end portion and
    an upper end portion closed with an upper wall thereof, the sleeve being inserted into the first and second through holes and being vertically movable;
    a projection provided on an outer surface of the sleeve, the projection abutting against the stepped portion to restrict a rising movement of the sleeve and the projection being abutted against a peripheral portion of the second through hole to restrict a downward movement of the sleeve;
    a plunger inserted into the sleeve through the end portion to be vertically movable; and
    an elastic member disposed in the sleeve to urge the plunger downward and to urge the sleeve upward in a vertical attitude of the contact pin,
    and the upper end portion of the upper wall of said sleeve being a contact portion to contact the terminal of the electrical part to be electrically connected thereto and said plunger has a lower end contacting the printed circuit board to establish an electrical connection therebetween.

2. An IC socket for an electrical part according to claim 1, wherein said plunger is arranged to be vertically movable with respect to the socket body.

3. An IC socket for an electrical part according to claim 1, wherein said sleeve and said plunger are disposed to be relatively slidable to thereby establish an electrical connection therebetween.

4. An IC socket for an electrical part according to claim 1, wherein said contact portion of the sleeve is formed with a central recessed portion.

5. An IC socket for an electrical part according to claim 1, wherein said contact portion of the sleeve is formed with a plurality of sharp protruded portions.

6. An IC socket for an electrical part to establish an electrical connection between a printed circuit board and a terminal of an IC package, comprising:

a socket body on which the IC package is mounted; and a plurality of contact pins provided for the socket body through which a plurality of terminals of the electrical part are electrically connected to the printed circuit board, each of said contact pins comprising, in a vertical attitude thereof:

a sleeve having an inner space with an opened lower end portion and an upper end portion closed with an upper wall, the sleeve having an approximately cylindrical shape and having a substantially same outer diameter from the upper end portion to the lower end portion, a plunger inserted into the sleeve through the end portion to be vertically movable, an elastic member disposed in the sleeve to urge downward the plunger, and a projection provided on an outer surface at a longitudinal intermediate portion of the sleeve, an entire area of the upper end portion of the upper wall of the sleeve being able to be a contact portion to contact the terminal of the electrical part to be electrically connected thereto and said plunger has a lower end contacting the printed circuit board to establish an electrical connection therebetween, the socket body has a base on which a plate member is rested, said plate member being formed with a first through hole through which said sleeve is inserted to be vertically movable with respect to the socket body, the base being formed with a second through hole through which the sleeve is inserted, the first and second through holes being connected to each other by mounting the plate member on the base, the first through hole of the plate member is formed with a stepped portion to which said projection abuts when the sleeve is inserted into the first through hole formed in the plate member, to thereby restrict an upward movement of the sleeve, the projection abutting against a peripheral portion of the second through hole formed to the base, to thereby restrict a downward movement of the sleeve.

7. An IC socket for an electrical part according to claim 6, wherein said sleeve is composed of a tubular member into which the plunger is fitted and the elastic member is disposed, said elastic member is a coil spring which urges the plunger downward so as to abut against the printed circuit board to establish an electrical connection therebetween.

8. An IC socket for an electrical part according to claim 6, wherein the projection is an annular protruded projection provided on the outer surface of the sleeve.

9. An IC socket for an electrical part according to claim 6, wherein said contact portion of the sleeve is formed with a central recessed portion.

10. An IC socket for an electrical part according to claim 1, wherein the sleeve and the plunger have a round shape in cross section.

11. An IC socket for an electrical part according to claim 1, an upper surface of the projection and a lower surface of the stepped portion are flat so that the projection abuts against the stepped portion in a plane like contact.

12. An IC socket for an electrical part to electrically connect a terminal of the electrical part and a printed circuit board, the socket comprising:

a contact pin to electrically connect the terminal and the printed circuit board, said contact pin comprising:

a tubular sleeve having a space with an opened lower end portion and an upper end portion closed with an upper wall thereof, a longitudinal intermediate portion between the upper and lower end portions, the sleeve having a substantially same outer diameter from the upper end portion to the lower end portion, and a projection on an outer surface of the intermediate portion, an entire area of the upper end portion in contact with the terminal, the upper end portion of the upper wall of said sleeve being a contact portion to contact the terminal of the electrical part to be electrically connected thereto.

13. The IC socket for an electrical part according to claim 12, further comprising:

a plate having a first through hole formed therein, wherein the sleeve is inserted in the first through hole to be moveable with respect to the socket body in an axial direction of the contact pin; and a base on which the plate is rested, the base having a second through hole formed therein, the first through hole of the plate is formed with a stepped portion to which said projection abuts when the sleeve is inserted into the first through hole formed in the plate, to thereby restrict an upward movement of the sleeve, the projection abutting against a peripheral portion of the second through hole formed to the base, to thereby restrict a downward movement of the sleeve.

* * * * *